(12) United States Patent  
Theander

(10) Patent No.: US 10,624,244 B2
(45) Date of Patent: Apr. 14, 2020

(54) AUTOMOTIVE POWER ELECTRONICS ASSEMBLY

(71) Applicant: PREH GMBH, Bad Neustadt a. d. Saale (DE)

(72) Inventor: Adam Theander, Bankeryd (SE)

(73) Assignee: PREH GMBH, Bad Neustadt A. D. Saale (DE)

( * ) Notice: Subject to any disclaimer, the term of this patent is extended or adjusted under 35 U.S.C. 154(b) by 91 days.

(21) Appl. No.: 15/773,042

(22) PCT Filed: Nov. 4, 2015

(86) PCT No.: PCT/EP2015/075711
§ 371 (c)(1),
(2) Date: May 2, 2018

(87) PCT Pub. No.: WO2017/076442
PCT Pub. Date: May 11, 2017

(65) Prior Publication Data
US 2018/0368291 A1 Dec. 20, 2018

(51) Int. Cl.
*H05K 7/20* (2006.01)
*H01L 23/40* (2006.01)
(Continued)

(52) U.S. Cl.
CPC ..... *H05K 7/20927* (2013.01); *H01L 23/4006* (2013.01); *H01L 23/4093* (2013.01);
(Continued)

(58) Field of Classification Search
CPC ............. H01L 23/4006; H01L 23/4093; H01L 23/473; H01L 25/00; H05K 1/0203; H05K 7/20927
See application file for complete search history.

(56) References Cited

U.S. PATENT DOCUMENTS 4,669,028 A * 5/1987 Faa, Jr. ............... H01L 23/4006
165/185
5,504,653 A 4/1996 Murphy et al.
(Continued)

FOREIGN PATENT DOCUMENTS

CN 101248710 A 8/2008
CN 203242611 U 10/2013
(Continued)

OTHER PUBLICATIONS

First Office Action for Chinese Patent Application No. 2015800843448, dated May 13, 2019, CNIPA.
(Continued)

*Primary Examiner* — Jacob R Crum
(74) *Attorney, Agent, or Firm* — M&B IP Analysts, LLC

(57) ABSTRACT

An automotive power electronics assembly, including: a cover plate, a cooling pipe received in a groove extending along a first surface of the cover plate, a plurality of metallic heat sink bodies provided on a second, opposite surface of the cover plate wherein first end faces of the hear sink bodies are in heat conducting contact with the cover plate, each heat sink body carrying on a side surface at least one semiconductor component to be cooled, and a printed circuit board providing electronic contacts to the semiconductor components, where the printed circuit board is in contact with second end faces of the heat sink bodies. Each heat sink body tapers from the first end face to the second end face such that the contact area with the cover plate is larger than the contact area with the printed circuit board.

7 Claims, 3 Drawing Sheets

(51) Int. Cl.
*H01L 23/473* (2006.01)
*H01L 25/00* (2006.01)
*H05K 1/02* (2006.01)

(52) U.S. Cl.
CPC ............ *H01L 23/473* (2013.01); *H01L 25/00* (2013.01); *H05K 1/0203* (2013.01)

(56) References Cited

U.S. PATENT DOCUMENTS

| | | | |
|---|---|---|---|
| 6,144,092 A | 11/2000 | Kappes et al. | |
| 2002/0039282 A1* | 4/2002 | Han | G11C 5/04 361/719 |
| 2006/0227504 A1* | 10/2006 | Chen | H01L 23/467 361/679.47 |
| 2008/0212281 A1 | 9/2008 | Kerner et al. | |
| 2013/0235527 A1 | 9/2013 | Wagner et al. | |
| 2014/0104776 A1* | 4/2014 | Clayton | H05K 1/181 361/679.31 |
| 2016/0157384 A1* | 6/2016 | Liu | H05K 1/028 361/709 |

FOREIGN PATENT DOCUMENTS

| | | |
|---|---|---|
| CN | 203773455 U | 8/2014 |
| DE | 102012223369 A1 | 3/2014 |

OTHER PUBLICATIONS

The International Search Report and the Written Opinion for PCT/EP2015/075711, ISA/EPO, The Netherlands, dated Jul. 20, 2016.

* cited by examiner

AUTOMOTIVE POWER ELECTRONICS ASSEMBLY

This application claims priority under 35 U.S.C. § 371 to the International Application No. PCT/EP2015/075711, filed Nov. 4, 2015, now pending, the contents of which are hereby incorporated by reference.

The present disclosure is directed to an automotive power electronics assembly comprising a cover plate of metal, a cooling pipe received in a groove extending along a first surface of the cover plate, a plurality of metallic heat sink bodies provided on a second, opposite surface of the cover plate and where first end faces are in heat conducting contact therewith, each heat sink body carrying on a side surface at least one semiconductor component to be cooled, and a printed circuit board disposed at a distance to the second surface of the cover plate and providing electronic contacts for the semiconductor components, where a printed circuit board is in contact with second end faces of the heat sink bodies opposite to the first end faces in contact with the second surface of the cover plate.

Power electronics assemblies utilize, among other electric circuit elements, solid-state electronic circuit components for control and conversion of electric power. In state of the art of power electronic assemblies, power conversion is performed by semiconductor components such as diodes, thyristors, triacs and transistors. A typical power electronics device is an AC/DC converter (rectifier). Compared to electronic devices for transmission and processing of electronic signals and data, power electronics devices process substantially higher amounts of electrical energy. As a consequence the semiconductor components utilized for converting and handling high amounts of electrical energy generate substantial amounts of heat, and therefore need to be cooled in order to avoid damages or failure of the components. For this purpose it is known to mount semiconductor components on heat sink bodies having a high thermal conductivity. The heat sink bodies in turn are in thermal contact with a cooling pipe through which a cooling fluid is flowing to dissipate heat from the semiconductor components. Such power electronics assemblies including cooling fluid arrangements are for example described in U.S. Pat. No. 5,829,516 B1 and US 2014/0225249 A1.

Power electronic assemblies also find application in the automotive industry, for example as battery chargers. In particular in hybrid vehicles which use an electric motor in addition to a conventional combustion engine, power electronics assemblies are utilized for converting electrical energy generated by mechanical energy produced when the vehicle is decelerating, and for charging batteries with the electrical energy generated.

An example for an automotive power electronic assembly is the ELTEK/Valeo on board charger. This power electronic assembly comprises a cover plate of casted metal. On a first surface of the cover plate grooves are formed, and a generally U-shaped cooling tube is press fitted in the grooves of the cover plate. Inlet and outlet ports of the U-shaped cooling pipe project from one of the side edges of the cover plate to be connected to a cooling fluid circuit. On the second surface of the cover plate opposite to the first surface there are mounting structures for electrical components of the power electronics assembly. In addition there are heat sink bodies in heat conducting contact with the second surface of the cover plate. The heat sink bodies are made of metal and have the shape of a flat cube with a semiconductor component mounted on each of the large opposite surfaces of the plate-shaped heat sink body. A printed circuit board is in contact with end faces of the heat sink bodies opposite to the end faces in contact with the cover plate. The cube or plate-like rectangular shape of the heat sink bodies implies a uniform cross-sectional area along their longitudinal extension from the first end face in contact with the cover plate to the second end face in contact with the printed circuit board. The semiconductor components carried on the side walls of the heat sink bodies are connected by conductors to the printed circuit board.

It is an object of the present disclosure to provide an automotive power electronic assembly with improved cooling efficiency for the semiconductor components included therein. In addition it would be advantageous if the semiconductor components could be connected via the printed circuit board with short conductor trace lengths on the printed circuit board.

This object is achieved by an automotive power electronic assembly comprising the features discussed herein.

According to the present disclosure each heat sink body has a shape that tapers from the first end face in contact with the cover plate to the second end face in contact with the printed circuit board such that the contact area with the cover plate is larger than the contact area with the printed circuit board. The tapering shape of each heat sink body includes opposite side walls which converge towards each other with increasing distance from the cover plate and which carry the semiconductor components.

The tapering heat sink body on the one hand allows to provide for a large contact area with the cover plate and thus for a large area for heat conduction to the cooled cover plate. On the other hand the opposite converging side walls permit to keep the contact area with the printed circuit board smaller. This implies that the overall length of the conductor which connects one semiconductor component with a conductive trace on the printed circuit board, the conductor length connecting the semi-conductor component on the opposite side wall of the heat sink body to the conductive trace on the printed circuit board and the length of the conductive trace between the contacts with the conductors can be kept relatively small since the ends of the semiconductor components facing the printed circuit board are closer together compared to the case of a cubic heat sink body with the same contact area with the cover plate. Small conductor lengths and lengths of conductive traces on the printed circuit board are advantageous for the following reasons.

Electrical performance is improved by having shorter connection traces, such as minimizing interference created by the traces acting as transmitting and receiving antennas which could cause the assembly to produce EMI (electromagnetic interference) noise or amplify EMI noise present in the operational environment. In other words shorter conducting traces improve the electromagnetic compatibility (EMC) characteristics of the assembly. Furthermore resistance of a trace is increasing with increasing length of the trace, which results in higher power losses in the power transmission due to heat generation. In addition, longer traces increase the transmission time delay on each segment, which lowers the performance of the equipment, and the ability to control the system adequately. Finally, the longer the traces the higher are the inductances and capacitances and the higher is the susceptibility to resonance oscillations at the characteristic frequency of the circuit (which is also referred to as ringing phenomenon). Thus, the reduction of the length of conducting traces between semiconductor devices on the opposite tapering sidewalls of the heat sink bodies improves the performance of the power electronics assembly according to the present disclosure with respect to many aspects.

In an embodiment, each heat sink body has the shape of a truncated prism with the large base area defining the first end face and the plane cutting of the apex of the prism forming the second end face opposite to the first end face. In case the original prism was as symmetric prism there are two opposite converging side walls being inclined at the same angle with respect to the first end face, and there are two opposite parallel side walls having the shape of an isosceles triangle which is truncated at the top. The distance between the opposite two parallel side walls determines a length of the truncated prism and determines how many semiconductor components can be placed next to each other on the opposite converging side walls.

There are many other possible shapes with converging opposite side walls, for example truncated pyramids with two pairs of converging opposite side walls. Another example is a truncated wedge-shaped heat sink body having rectangular base as first end face, one sidewall extending perpendicularly therefrom to the second end face and an opposite side wall being inclined with respect to the base surface and tapering towards the perpendicular side wall to the second end face. The further two side walls are disposed in parallel planes and have the shape of a right-angled triangle with a top corner cut off.

In an embodiment, the heat sink bodies are formed as at least one twin arrangement, each heat sink body twin arrangement having a pair of neighboring heat sink bodies in parallel which are connected by an integrally formed connecting portion such that the first end faces of the heat sink bodies and the adjoining end face of the connecting portion form a common contact area with the cover plate. This common contact area is due to the additional area of the end face of the connecting portion, larger than the sum of the first end faces of the two heat sink bodies which further improves heat conduction from the heat sink bodies to the cover plate.

In an embodiment, a pair of two first heat sink body twin arrangements is provided which are disposed on the cover plate side by side with the heat sink bodies and the connecting portions aligned in a transverse direction of the cover plate. The second end faces of a pair of two heat sink body twin arrangements provide for a distributed support of the printed circuit board by the second end faces of the heat sink bodies, which second end faces are spaced a part in the transverse direction of the cover plate to improve mechanical stability.

In an embodiment, there are two second heat sink body twin arrangements disposed on the cover plate side by side with the heat sink bodies and the connecting portions aligned in the transverse direction of the cover plate, wherein the two first heat sink body twin arrangements are disposed at a distance to the second heat sink body twin arrangements in a longitudinal direction of the cover plate perpendicular to the transverse direction. This arrangement provides for further second end faces of heat sink bodies in contact with the printed circuit board, wherein the contact areas are distributed along the longitudinal and transverse directions to improve mechanical stability and support of the printed circuit board.

In an embodiment, the cooling pipe is arranged on the first surface of the cover plate and the heat sink body twin arrangement(s) is (are) disposed on the second surface of the cover plate such that the cooling pipe, when projected to the second surface of the cover plate, is intersecting the connecting portion(s) in a direction perpendicular to a line connecting the two heat sink bodies of the heat sink body twin arrangement(s). In this manner the cooling pipe efficiently cool the connecting portion of each of the heat sink body twin arrangements, with the two heat sink bodies of the twin arrangement being disposed symmetrically around the connecting portion which is located in the region of the crossing cooling pipe on the opposite side of the cover plate. Both heat sink bodies of the twin arrangement are cooled in this way in an efficient manner by a single cooling pipe on the opposite side of the cover plate.

In an embodiment, the cover plate and the heat sink bodies are made of aluminum.

According to a further aspect, the present disclosure provides an automotive power electronics assembly combination comprising a first and a second automotive power electronics assembly as described before. The first cover plate and the second cover plate and the second cover plate of the first and second automotive power electronics assemblies are of the same design, wherein the extension of the cooling pipe and of the grooves in the first surfaces are symmetric under a 180° around a longitudinal axis of the cover plates. The cover plates are disposed on top of each other but with the second cover plate being rotated around its longitudinal axis by 180° such that the first surfaces of the cover plates of the first and second automotive power electronics assemblies face each other and are fitted with their grooves and share the same cooling pipe. This arrangement of two combined automotive power electronics assemblies allows for a particular compact design and efficient use of the cooling pipe.

The present disclosure will in the following be described in connection with an embodiment shown in the drawings in which.

Figure 1:
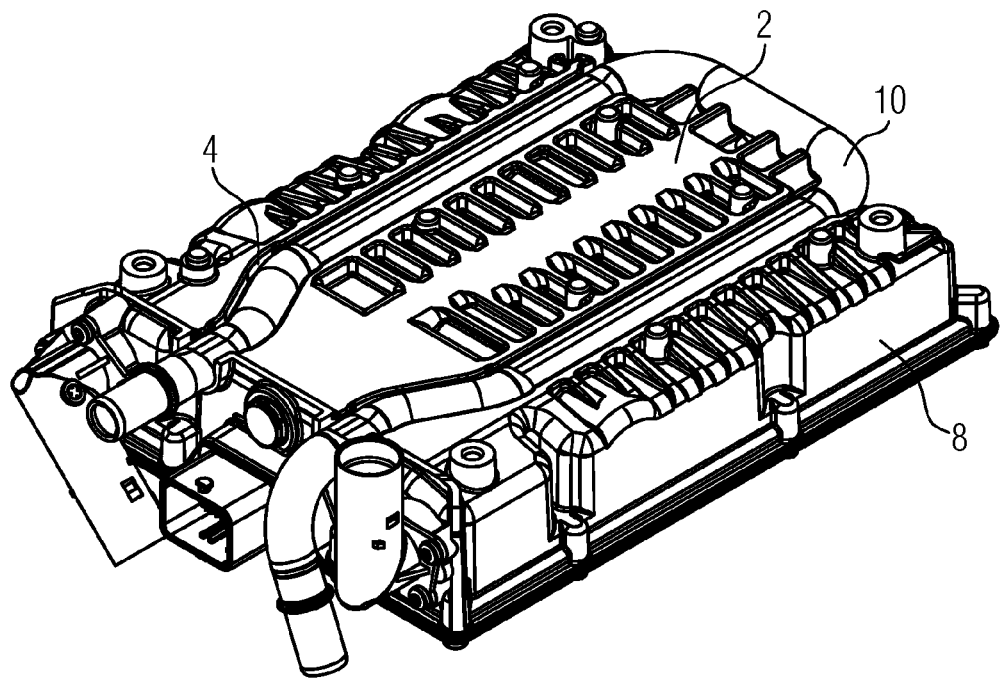
FIG. 1 shows a perspective view of an embodiment of an automotive power electronics assembly according to the present disclosure.

Referring to the perspective view of FIG. 1 the automotive power electronics assembly comprises a cover plate 2 which in this embodiment forms part of an upper housing member together with integrally formed side walls 8 which form a rectangular bowl open on the underside. On a first surface (upper surface) of the cover plate 2 a groove 4 is formed which is arranged to receive a generally U-shaped cooling pipe which is press-fitted into the groove 4. This cooling pipe 10 allows to circulate a cooling fluid to remove thermal energy from the cover plate 2.

Figure 2:
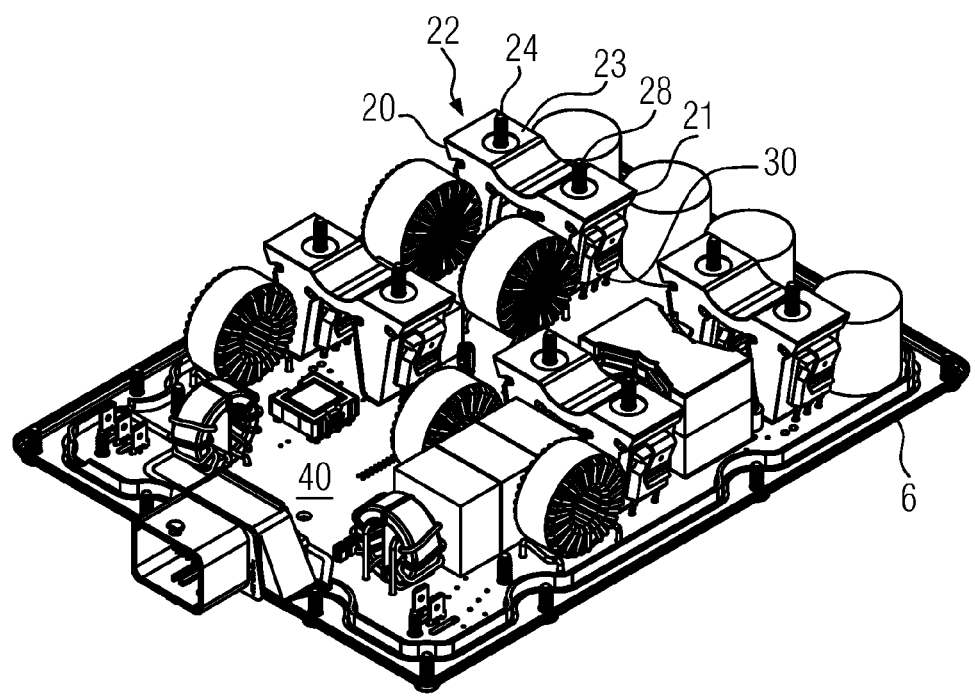
FIG. 2 shows a perspective view of the automotive power electronics assembly of FIG. 1 with an upper housing part removed.

As can be seen in the perspective view of FIG. 2 there is an essentially planar lower housing part 6 which supports a printed circuit board 40. On the printed circuit board 40 many electrical components of the power electronics assembly such as coils etc. are mounted which will not be described in further detail here. Furthermore, there are heat sink bodies 20, 21 connected to the printed circuit board 40 and connected to the cover plate 2 on a second surface thereof opposite to the surface including the groove 4 and the cooling part 10.

The design of the heat sink bodies 20, 21 will now be described with reference to FIGS. 2 to 5. In the embodiment shown in the drawings, the heat sink bodies 20, 21 are arranged as heat sink body twin arrangements 22. It should be noted that in the Figures only one of the heat sink body twin arrangements is provided with reference numerals. Each heat sink body twin arrangement 22 comprises a pair of heat sink bodies 20, 21 disposed side by side in parallel. The pair of heat sink bodies 20, 21 is connected by an integrally formed connecting portion 23 extending between the two heat sink bodies 20, 21 of the heat sink body twin arrangement 22. The connecting portion 23 enlarges the contact area to the cover plate 2 and further improves heat conduction to the cover plate 2.

Each heat sink body 20, 21, when the considered in individually without the adjoining connecting portion 23, has, in the shown embodiment, the shape of a truncated prism, with two converging planar side walls which are tapering towards each other in the direction from the first end face 24 to the second end face 26 of the heat sink body. In the embodiment shown, the original prism was a symmetric prism. Besides the opposing converging side walls there are two further planar side walls which have the shape of an isosceles triangle with a truncated top apex. These two opposite side walls are disposed in parallel planes opposite to each other.

The semiconductor components 30 are disposed on the opposite converging side walls of the heat sink bodies 20, 21. The semiconductor components 30 are pressed onto the converging opposite side walls by elastic clamps as can best be seen in FIG. 4. Conductors 32 (see FIG. 4) extend from the semiconductor components to the printed circuit board where they are electrically connected to contact points in contact with conductive traces on the printed circuit board.

The large base area of the truncated prism forms the first end face 24 of a heat sink body 20, 21. The opposite second end face 26 is formed by the truncation of the original prism, where the truncation cuts off the apex of the original symmetric prism in a plane parallel to the first end face 24. Due to the tapering, converging side walls the cross-sectional area of the heat sink body 20, 21 decreases with increasing distance from the first end face 24 and becomes minimal at the second end face 26. Due to this arrangement the contact area to the cover plate 2 can be made large in order to ensure efficient heat conduction from the heat sink bodies 20, 21 to the cover plate 2. On the other hand, the relatively smaller opposite second end face 26 permits that the conductors 32 from the semiconductor components 30 on the opposite converging side walls are also converging and have contact points on the printed circuit board 40 that are closer together compared to the case of a cubic heat sink body with the same area of the first end face 24. Due to the closer contact points on the printed circuit board the conductor traces connecting the contact points can be shorter, as can for example be seen in FIG. 4. Shorter conductive traces on the printed circuit board between the contact points of the semiconductor components 30 on the opposite converging side walls of a heat sink body are advantageous because the susceptibility to interference and other noise of the power electronics assembly is reduced and other performance characteristics are improved as has been explained above.

Figure 5:
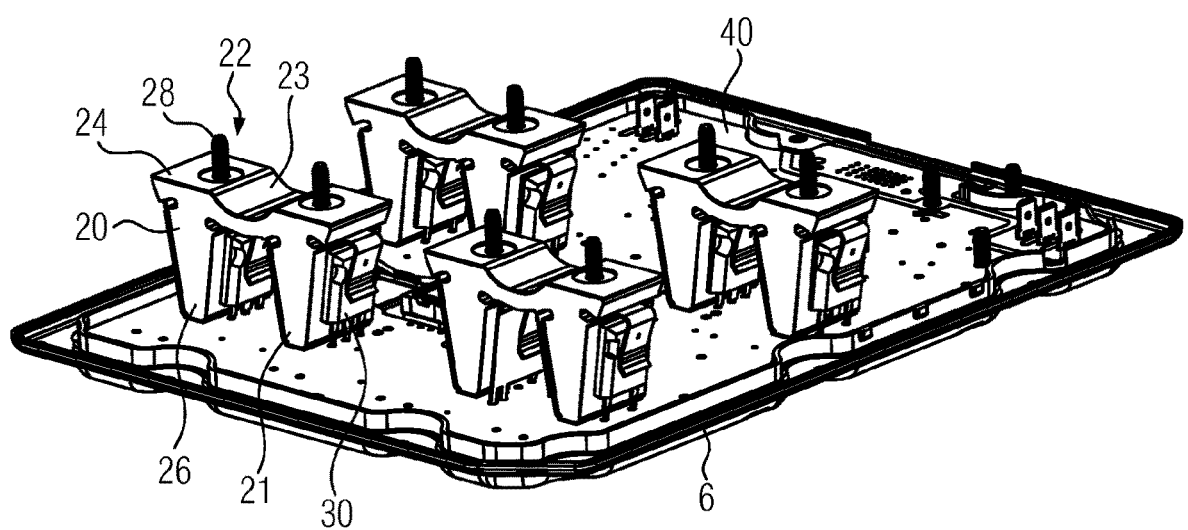
FIG. 5 shows a perspective view of a lower portion of the power electronics assembly with electric components other than the semiconductor components on the heat sink bodies removed to simplify illustration.

As can be seen in FIGS. 2 and 5 there are four heat sink body twin arrangements 22 of the same design distributed over the printed circuit board 40. Two first heat sink body twin arrangements 22 are disposed side by side with the heat sink bodies 20, 21 and the connecting portions 23 aligned in a transverse direction of the cover plate 2 (the direction of smaller extension of the rectangular cover plate 2 is referred to as transverse direction). Furthermore, there is a second row of two aligned heat sink body twin arrangements 22 displaced in longitudinal direction of the printed circuit board such that the four heat sink body twin arrangements 22 are disposed on the corners of a hypothetical rectangle. In this manner a stable mechanical support of the printed circuit board 40 by the second end faces 26 of the heat sink bodies 20, 21 is obtained. This is important for long-term stability and durability of the printed circuit board and the components connected thereto, and for the resistance of the assembly to withstand vibrations which frequently occur in automotive applications.

Figure 3:
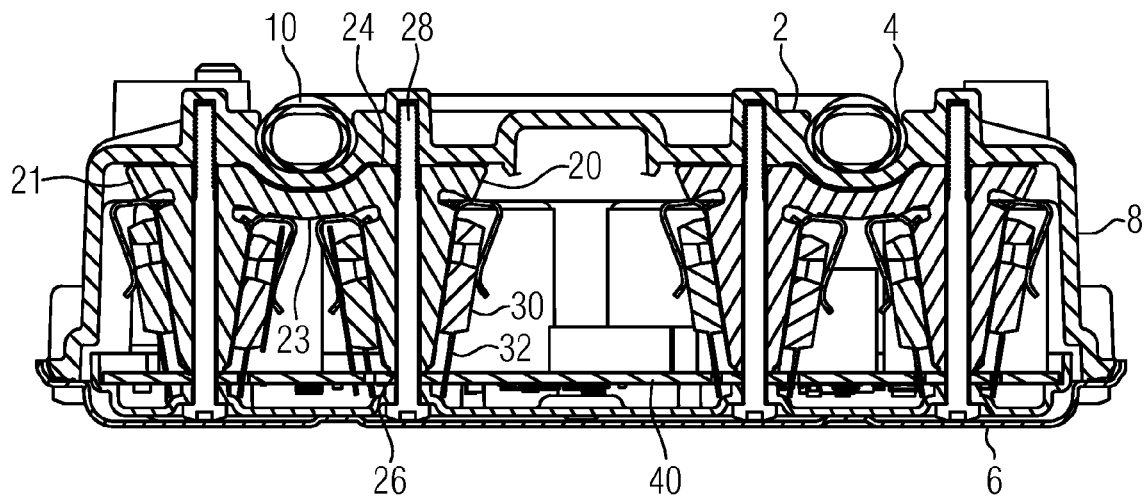
FIG. 3 shows a cross-sectional view of the automotive power electronics assembly of FIGS. 1 and 2.
Figure 4:
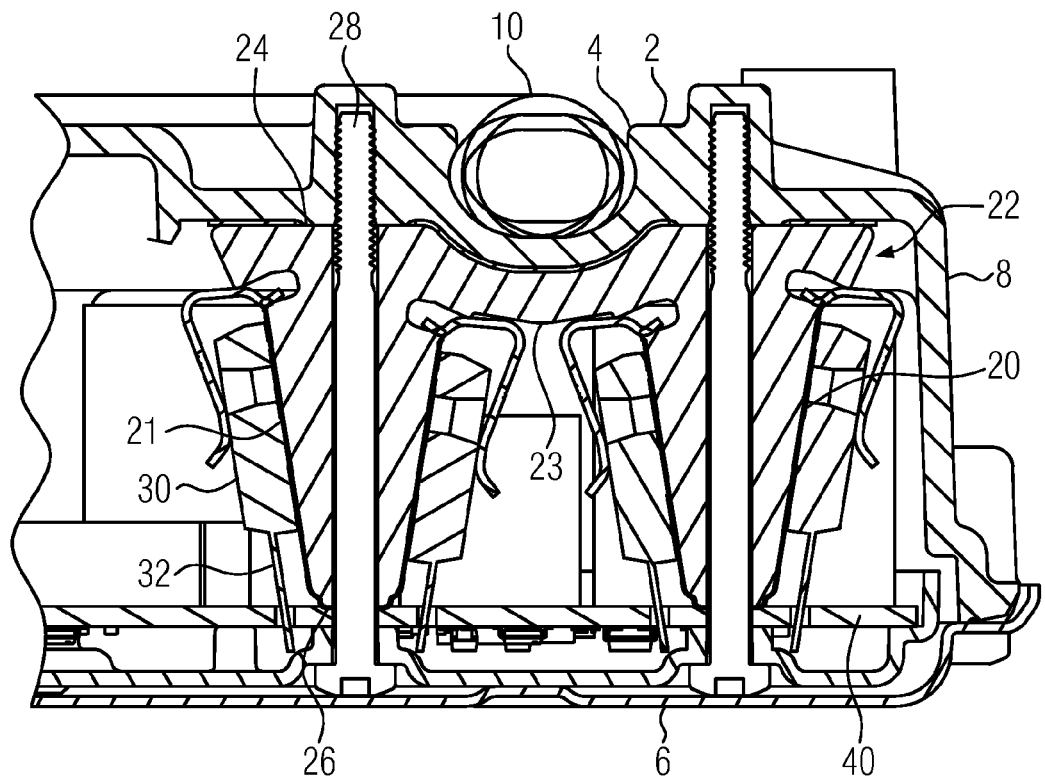
FIG. 4 shows an enlarged partial view of the cross-section of FIG. 3.

As can for example be seen in FIGS. 3 and 4 there are threaded bolts 28 connecting an intermediate bottom plate below the printed circuit board 40 and extending through heat sink bodies 20, 21, which bolts 28 are received in threaded holes in the cover plate 2 to fix and support the assembly of lower bottom plate 6, the attached intermediate bottom plate supporting the printed circuit board 40, the heat sink bodies 20, 21 and the cover plate 2 as an mechanically stable arrangement.

The upper housing member including the base plate 2 and side walls 8 can for example be made as an extruded aluminum part. The heat sink bodies can also be made of aluminum.

Considering the view of FIG. 3 and a modified embodiment (not shown) in which the grooves on the upper surface of the cover plate 2 are arranged such that only one half of the cross-section of the cooling tube is received therein, and the upper surface of the cover plate 2 is shaped such that there are no portion projecting beyond a level defined by the edges of the grooves 4, a very compact aggregation can be realized as follows. A second power electronics assembly with a cover plate of the same design could be placed on top of the first one rotated by 180° around the longitudinal axis (axis perpendicular to the Figure plane of FIG. 3) such that the upper halves of the cooling pipe is received in the groove of the upper second base plate to form a symmetric and compact arrangement. Such a construction implies that the shape of the cooling pipe and the extension of the groove are symmetric under 180° rotations around the longitudinal axis. In this manner a very compact design can be achieved.

The invention claimed is:

1. An automotive power electronics assembly comprising:
a cover plate;
a cooling pipe received in a groove extending along a first surface of the cover plate;
a plurality of heat sink bodies provided on a second, opposite surface of the cover plate and wherein first end faces of the heat sink bodies are in heat conducting contact with the opposite surface of the cover plate, each heat sink body carrying on a side surface at least one semiconductor component to be cooled;
and a printed circuit board disposed at a distance to the second surface of the cover plate and providing electronic contacts to the semiconductor components, where the printed circuit board is in contact with second end faces of the heat sink bodies opposite to the first end faces in contact with the second surface of the cover plate, characterized in that each heat sink body tapers from the first end face in contact with the cover plate to the second end face in contact with the printed circuit board such that the contact area with the cover plate is larger than the contact area with the printed circuit board, wherein the tapering shape of each heat sink body includes opposite side walls which converge towards each other with increasing distance from the cover plate and which carry the semiconductor components.

2. The automotive power electronics of claim 1, wherein each heat sink body has the shape of a truncated prism with a large base area defining the first end face and a plane cutting an apex of the prism forming the second end face.

3. The automotive power electronics assembly of claim 1, wherein the heat sink bodies are formed in at least one twin arrangement, each heat sink body twin arrangement having a pair of neighboring heat sink bodies of the same design in parallel that are connected by an integrally formed connecting portion such that the first end faces of the heat sink bodies and the adjoining end face of the connecting portion form a common contact area with the cover plate.

4. The automotive power electronics assembly of claim 3, wherein two first heat sink body twin arrangements are disposed on the cover plate side by side with the heat sink bodies and connecting portions thereof are aligned in a transverse direction of the cover plate.

5. The automotive power electronics assembly of claim 4, wherein two second heat sink body twin arrangements are disposed on the cover plate side by side with the heat sink bodies and the connecting portions aligned in the transverse direction of the cover plate, wherein the two first heat sink body twin arrangements are disposed at a distance to the second heat sink body twin arrangements in a longitudinal direction of the cover plate perpendicular to the transverse direction.

6. The automotive power electronics assembly of claim 3, wherein the cooling pipe is arranged on the first surface of the cover plate and the heat sink body twin arrangement is disposed on the second surface of the cover plate such that the cooling pipe, when projected to the second surface of the cover plate, is intersecting the connecting portion of the heat sink body twin arrangement.

7. The automotive power electronics assembly of claim 1, wherein the cover plate and the heat sink bodies are made of aluminum.

\* \* \* \* \*